United States Patent
North et al.

(10) Patent No.: US 7,900,652 B2
(45) Date of Patent: Mar. 8, 2011

(54) GAS SUPPLY SYSTEM FOR A PUMPING ARRANGEMENT

(75) Inventors: Phillip North, Horsham (GB); David Paul Manson, Newhaven (GB)

(73) Assignee: Edwards Limited, Crawley, West Sussex (GB)

( * ) Notice: Subject to any disclaimer, the term of this patent is extended or adjusted under 35 U.S.C. 154(b) by 1137 days.

(21) Appl. No.: 11/596,794

(22) PCT Filed: Apr. 26, 2005

(86) PCT No.: PCT/GB2005/001580

§ 371 (c)(1),
(2), (4) Date: Nov. 17, 2006

(87) PCT Pub. No.: WO2005/116452

PCT Pub. Date: Dec. 8, 2005

(65) Prior Publication Data

US 2009/0101214 A1    Apr. 23, 2009

(30) Foreign Application Priority Data

May 25, 2004    (GB) .................................. 0411679.4

(51) Int. Cl.
*F04B 53/00* (2006.01)
(52) U.S. Cl. ..................................... 137/883; 417/423.4
(58) Field of Classification Search ............. 137/625.31, 137/625.32, 625.46, 883; 417/423.4
See application file for complete search history.

(56) References Cited

U.S. PATENT DOCUMENTS

| 4,725,204 | A | 2/1988 | Powell |
| 6,155,502 | A | 12/2000 | Liou et al. |
| 6,341,615 | B1 * | 1/2002 | Zorich et al. ..................... 137/14 |
| 2001/0054377 | A1 | 12/2001 | Lindfors et al. |
| 2008/0017260 | A1 * | 1/2008 | Oh et al. ..................... 137/625.3 |

FOREIGN PATENT DOCUMENTS

| FR | 1 118 136 A | 5/1956 |
| JP | 63-106389 | 5/1988 |
| JP | 10-259793 | 9/1998 |

OTHER PUBLICATIONS

Iguchi Masashi, Sakurai Mitsuru, Okamoto Masatomo; Abstract of JP10259793 A, entitled "Molecular Pump," Osaka Shinku Kiki Seisakusho; Sep. 29, 1998.
Naya Kotaro, Mihashi Shinji, Shiiki Kazuaki, Hayakawa Tadashi;Abstract of JP63106389 A, entitled "Injection Device for Screw Type Vacuum Pump," Hitachi Ltd; May 11, 1988.
United Kingdom Search Report of Application No. GB0411679.4 mailed Aug. 13, 2004; Claims Searched: 1-21; Date of Search: Aug. 12, 2004.
PCT Notification of Transmittal of the International Search Report and the Written Opinion of the International Searching Authority, or the Declaration of International Application No. PCT/GB2005/001580; Date of mailing: Sep. 14, 2005.

(Continued)

*Primary Examiner* — John Fox

(57) ABSTRACT

A system (100) for supplying an inert purge gas to a pumping arrangement (106) includes a plurality of flexible capillary tubes (102) each for conveying the gas from a respective outlet of a manifold (12) to a respective port (104) of the pumping arrangement (106). The internal diameter and length of each tube (102) control the gas flow rate to the respective port (104).

20 Claims, 3 Drawing Sheets

OTHER PUBLICATIONS

PCT International Search Report of International Application No. PCT/GB2005/001580; Date of mailing of the International Search Report: Sep. 14, 2005.

PCT Written Opinion of the International Searching Authority of International Application No. PCT/GB2005/001580; Date of mailing: Sep. 14, 2005.

* cited by examiner

GAS SUPPLY SYSTEM FOR A PUMPING ARRANGEMENT

FIELD OF THE INVENTION

This invention relates to a system for supplying an inert purge gas to a pumping arrangement.

BACKGROUND OF THE INVENTION

Vacuum pumping arrangements used to pump fluid from semiconductor tools typically employ, as a backing pump, a multi-stage positive displacement pump employing intermeshing rotors. The rotors may have the same type of profile in each stage or the profile may change from stage to stage.

During semiconductor processes such as chemical vapour deposition processing, deposition gases are supplied to a process chamber to form a deposition layer on the surface of a substrate. As the residence time in the chamber of the deposition gas is relatively short, only a small proportion of the gas supplied to the chamber is consumed during the deposition process. Consequently, unconsumed gas molecules pumped from the chamber by a vacuum pump can pass through the pump in a highly reactive state. As a result, pump components can be subjected to damage due to corrosion and degradation resulting from the pumping of aggressive, unconsumed gas molecules. Furthermore, if the unconsumed process gas or by-product is condensable, sublimation on lower temperature surfaces can result in the accumulation of powder or dust within the pump, which can effectively fill the vacant running clearance between the rotor and stator elements of the pump. Other processes use gases that can result in potentially flammable mixtures forming in the pump.

To dilute these gases as they pass through the pump, an inert purge gas, such as nitrogen, can be supplied to the pump. As this gas can also serve to increase the longevity and effectiveness of dynamic shaft seals of the pump, and can ensure that certain sensors within the pumping arrangement are maintained in a clean and functional state, it is typically supplied through a plurality of purge ports provided at various locations about the pumping arrangement.

FIG. 1 illustrates a typical system for supplying purge gas to a number of purge ports. The system 10 comprises a manifold 12 having an inlet 14 and a plurality of outlets 16. The inlet 14 is connected to a source 18 of purge gas, such as nitrogen or helium, via a conduit 20, which includes a check valve 22. As the pressure of the purge gas at the source 18 may be variable, for example, within the range from 20 to 100 psi, the conduit 20 also includes a pressure regulator 24 for adjusting the pressure of the stream of purge gas conveyed to the inlet 14.

Within the manifold 12, the received stream of purge gas passes through a mass flow transducer 26 before being split into a plurality of streams for conveyance to the outlets 16. As the flow requirement at each outlet 16 may be different, depending on the purpose for which the purge gas is being supplied to a particular purge port of the pumping arrangement, the manifold 16 contains a relatively expensive arrangement of solenoid valves 28, fixed flow restrictors 30 and variable flow restrictors, for example needle valves, 32 for adjusting the flow rate of each stream of purge gas supplied to an outlet 16. Whilst the variable flow restrictors 32 can be replaced by relatively cheaper orifice plates as fixed flow restrictors, these are required to be machined to a very high accuracy which is difficult to achieve in practice, and in such systems several orifice plates are often modified during installation of the gas supply system to achieve the required flow rates to the manifold outlets.

The system 10 is typically connected to a pumping arrangement using rigid, usually stainless steel, pipes 34 of 4-5 mm internal diameter. These connecting pipes can undesirably transfer vibrations from the pumping arrangement to the gas supply system. Furthermore, the system is typically supplied with different sets of connecting pipes to enable the system to be connected to a range of different pumping mechanisms, which can significantly increase costs.

In at least its preferred embodiment, the present invention seeks to solve these and other problems.

SUMMARY OF THE INVENTION

In a first aspect, the present invention provides a method of supplying a purge gas to a pumping arrangement, the method comprising the step of conveying purge gas to a port of the pumping arrangement using a flexible capillary tube.

The tube may be sized to determine the flow rate of the purge gas to the port. For example, at least one of the internal diameter and the length of each capillary tube may be selected to provide a predetermined flow rate of purge gas to the respective port of the pumping arrangement.

The use of flexible capillary tubes of pre-defined sizes to convey purge gas to the purge ports of a pumping arrangement can replace the variable flow restrictors and rigid pipes of the prior gas supply system. As well as providing a cost saving by reducing the number of components of the gas supply system, this arrangement can provide a number of other advantages. Firstly, if the internal diameters of the tubes are chosen carefully, then the tolerance of the length to which each tube has to be cut can be very large without requiring any other flow adjustment mechanism. This can greatly simplify the installation of the system. In view of these large tolerances and the inherent flexibility of the capillary tubes, the system can be used on a number of different pumping arrangements without the need to provide a bespoke set of rigid connecting pipes for each pumping arrangement.

As well as facilitating installation, the inherent flexibility of the tubes can provide vibration isolation between the gas supply system and the pumping arrangement.

In its simplest embodiment, the flexible tube is connected to an outlet of a structure having an inlet for receiving a stream of purge gas from a source thereof.

In another embodiment, this structure may have a plurality of outlets, each outlet being connected to a respective port of the pumping arrangement. For example, this structure may comprise a manifold, or a standard pipe "tee" fitting, for splitting a received stream of purge gas into two or more streams. Each outlet from the structure is preferably connected to a respective port using a respective capillary tube.

In another aspect, the present invention provides a method of supplying a purge gas to a pumping arrangement, the method comprising the steps of receiving a stream of purge gas from a source thereof, and conveying the received purge gas to a port of the pumping arrangement using a flexible capillary tube.

In yet another aspect, the present invention provides a system for supplying a purge gas to a pumping arrangement, the system comprising means for receiving a stream of purge gas from a source thereof, and a flexible capillary tube for conveying the received purge gas to a port of the pumping arrangement.

A further aspect of the present invention provides a kit of parts comprising a structure having an inlet for receiving a flow of purge gas and at least one outlet for supplying the purge gas to a pumping arrangement, and a plurality of flexible capillary tubes of different size to enable a tube of chosen size to be connected to the, or a respective, outlet to convey a flow of purge gas to a port of the pumping arrangement.

Features described above relating to method aspects of the invention can be equally applied to system aspects, and vice versa.

BRIEF DESCRIPTION OF THE DRAWINGS

By way of example, an embodiment of the invention will now be further described with reference to the following Figures in which.

DETAILED DESCRIPTION OF THE INVENTION

Figure 1:
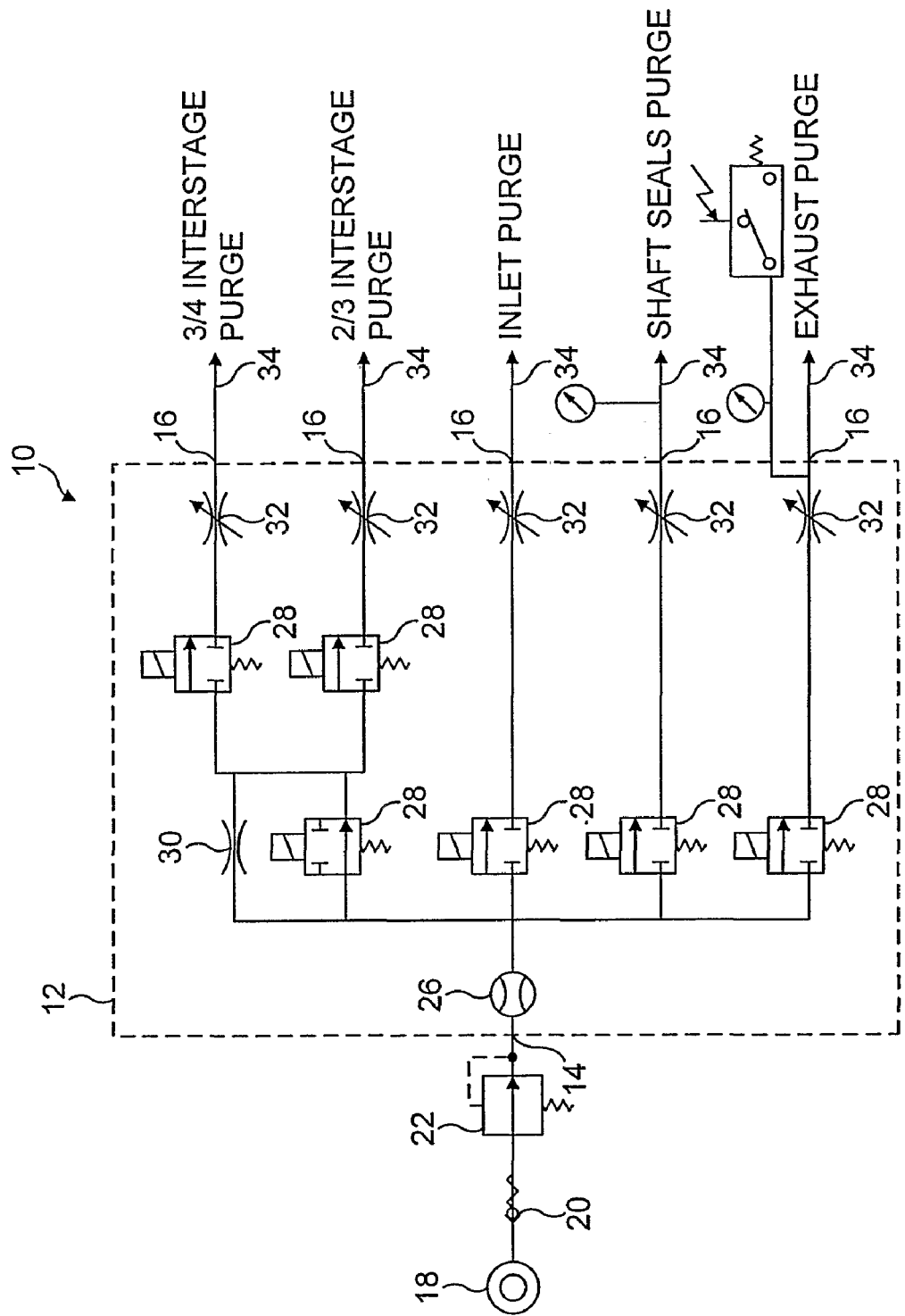
FIG. 1 illustrates a know system for supplying an inert purge gas to a pump.
Figure 2:
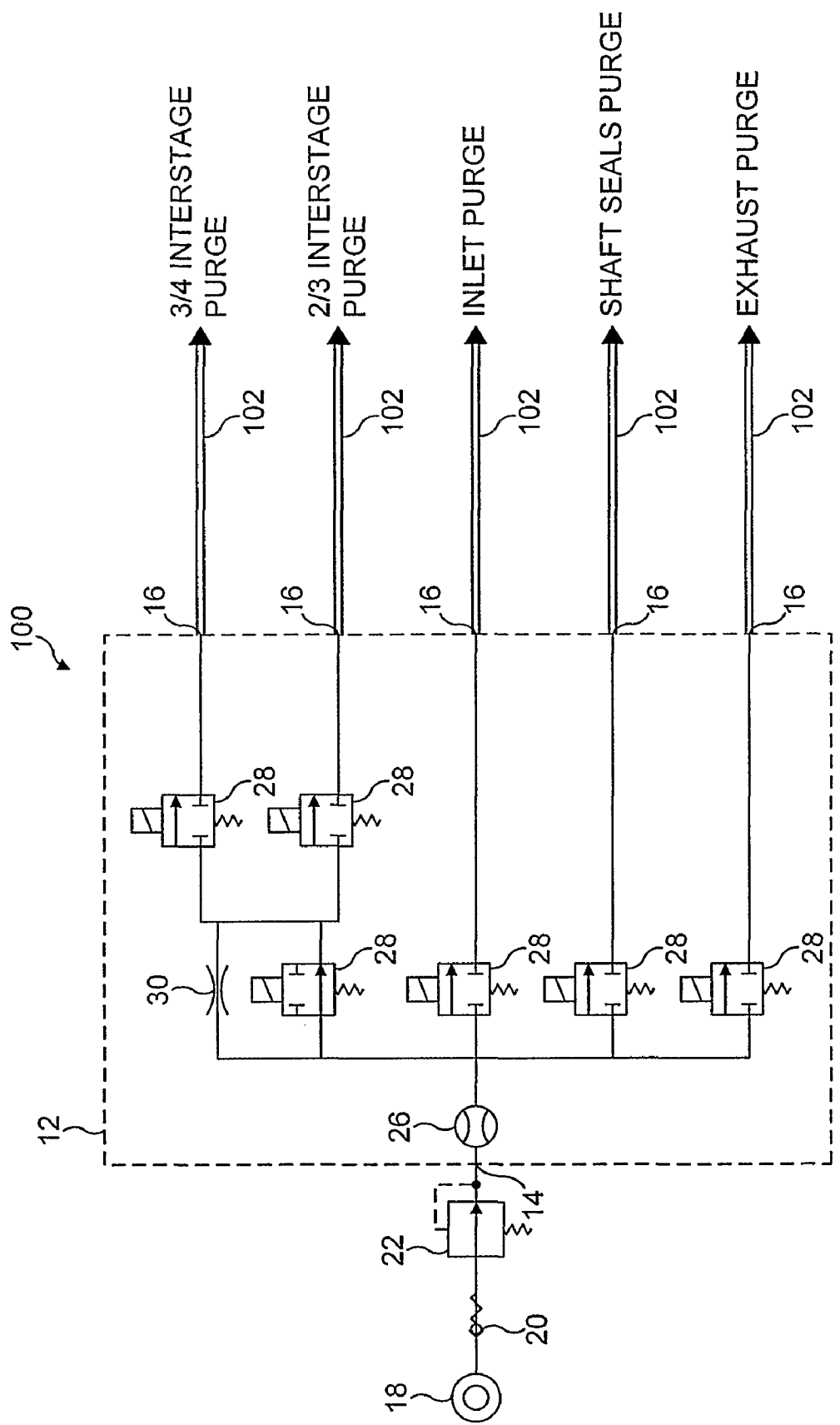
FIG. 2 illustrates an embodiment of a system in accordance with the present invention.
Figure 3:
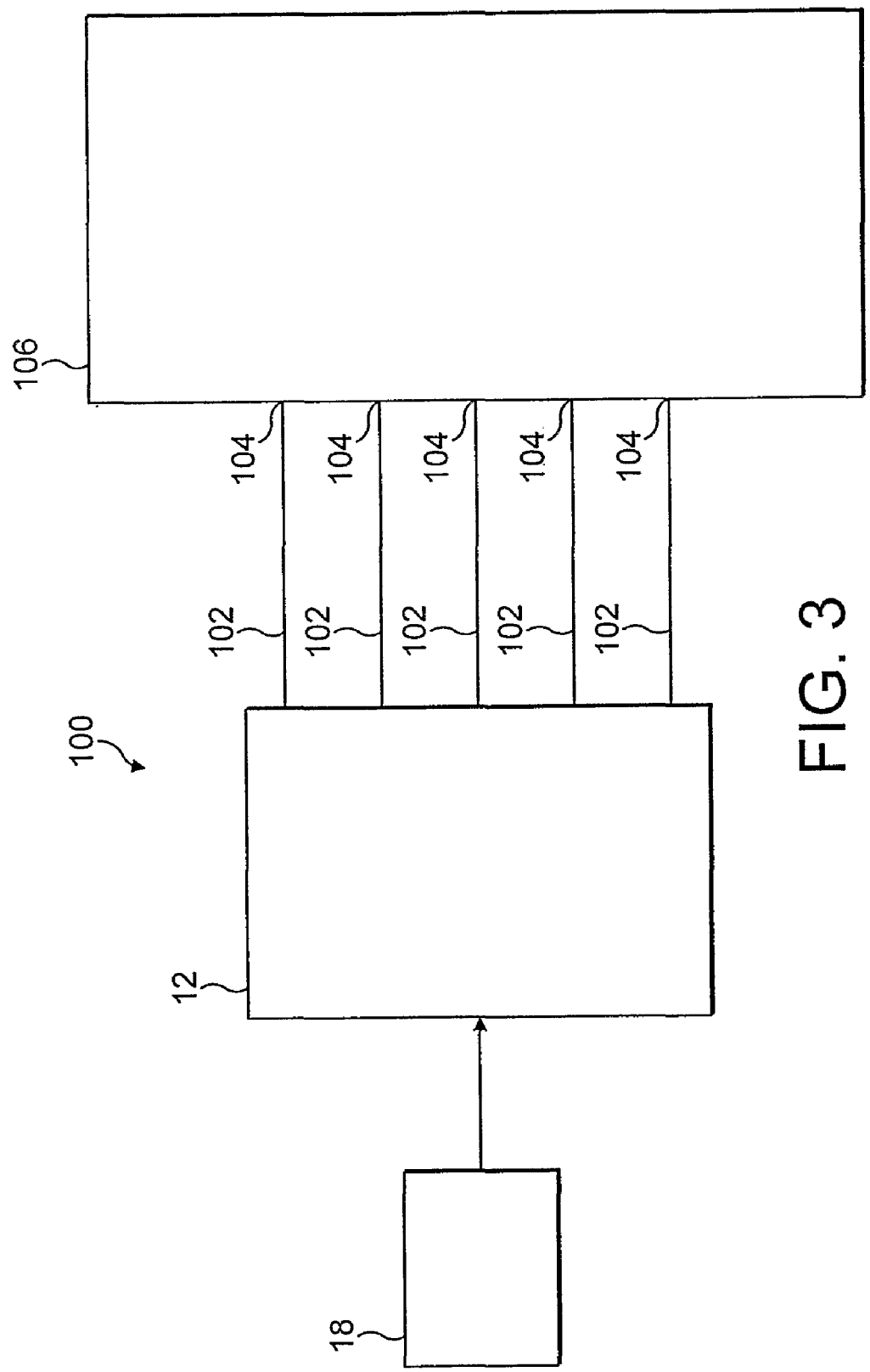
FIG. 3 illustrates the system of FIG. 2 connected to a pumping arrangement.

The gas supply system 100 of the embodiment illustrated in FIG. 2 differs from the known system previously described with reference to FIG. 1 insofar as the fixed flow restrictors 30 and the variable flow restrictors 32 located in the manifold 12 between the solenoid valves 28 and the outlets 16 have been removed, and the rigid pipes 34 have been replaced by flexible capillary tubes 102. As illustrated in FIG. 3, each capillary tube 102 is connected to a respective purge port 104 of a pumping arrangement 106. As indicated in FIG. 2, these ports 104 may be located at various locations, for example, proximate the inlet, exhaust, shaft seals, and/or at various locations between pumping stages of the pumping arrangement.

The internal diameter and the length of the tubes 102 determine the flow rate of the purge gas to the purge ports. The supply 100 may be provided with a plurality of tubes 102 of different diameter, for example, in the range from 1 mm to 5 mm. This can enable a user to select a tube 102 of appropriate diameter for connection to a particular purge port, which tube can then be cut to a particular length to provide the desired gas flow rate to that port. If the internal diameter of a particular tube 102 is chosen correctly, then the tolerance of the length to which that tube 102 has to be cut can be very large. As well as providing significant cost reductions, this can greatly simplify supply installation in comparison to the known system illustrated in FIG. 1 in view of the inherent flexibility of the capillary tubes 102, enabling a single set of tubes 102 to be provided in a kit including the manifold 12 to enable a user to connect the manifold 12 to one of a range of different pumping arrangements.

The flexibility of the tubes 102 is preferably such as, or chosen to, substantially isolate the manifold 12 from vibrations generated during use of the pumping arrangement. The tubes can therefore be used to provide a flexible coupling between a pumping arrangement and, for example, the manifold 12 shown in FIG. 1, that is, where the gas flow rates through the tubes 102 are determined using one or more restrictors (variable or fixed).

While the foregoing description and drawings represent the preferred embodiments of the present invention, it will be apparent to those skilled in the art that various changes and modifications may be made therein without departing from the true spirit and scope of the present invention.

We claim:

1. A method of supplying a purge gas to a pumping arrangement, the method comprising the step of conveying purge gas to a port of the pumping arrangement using a flexible capillary tube, wherein the flexibility of the tube is chosen to substantially isolate a source of the purge gas to the tube from vibrations generated during use of the pumping arrangement.

2. The method according to claim 1 wherein the tube is sized to determine the flow rate of the purge gas to the port.

3. The method according to claim 2 wherein at least one of the internal diameter and the length of each capillary tube is selected to provide a desired flow rate of purge gas to the port.

4. The method according to claim 1 wherein the pressure of the purge gas supplied to the tube is controlled.

5. The method according to claim 1 wherein the flexible tube is connected to an outlet of a structure having an inlet for receiving a stream of purge gas from a source thereof.

6. The method according to claim 5 wherein the structure has a plurality of outlets, each outlet being connected to a respective port of the pumping arrangement.

7. The method according to claim 6 wherein each outlet is connected to a respective port using a respective capillary tube.

8. The method according to claim 5 wherein the structure comprises a manifold.

9. The method according to claim 1 wherein the purge gas is an inert gas, preferably one of nitrogen and helium.

10. A method of supplying a purge gas to a pumping arrangement, the method comprising the steps of receiving a stream of purge gas from a source thereof, and conveying the received purge gas to a port of the pumping arrangement using a flexible capillary tube, wherein the flexibility of the tube is chosen to substantially isolate the receiving means from vibrations generated during use of the pumping arrangement.

11. A system for supplying a purge gas to a pumping arrangement, the system comprising means for receiving a stream of purge gas from a source thereof, and a flexible capillary tube for conveying the received purge gas to a port of the pumping arrangement, wherein the flexibility of the tube is chosen to substantially isolate the receiving means from vibrations generated during use of the pumping arrangement.

12. The system according to claim 11 wherein the tube is sized to determine the flow rate of purge gas therethrough.

13. The system according to claim 11 wherein the receiving means comprises an inlet for receiving the stream of purge gas from a source thereof, and at least one outlet connected to the flexible tube.

14. The system according to claim 13 wherein the receiving means has a plurality of outlets, each outlet being connected to a respective port of the pumping arrangement.

15. The system according to claim 14 wherein each outlet is connected to a respective port using a respective capillary tube.

16. The system according to claim 11 wherein the receiving means comprises a manifold.

17. The system according to claim 16 wherein the manifold comprises means for adjusting the pressure of the fluid supplied to the, or each, outlet thereof.

18. A kit of parts comprising a structure having an inlet for receiving a flow of purge gas and at least one outlet for supplying the purge gas to a pumping arrangement, and a plurality of flexible capillary tubes of different size to enable a tube of chosen size to be connected to the, or a respective, outlet to convey a flow of purge gas to a port of the pumping arrangement, wherein the flexibility of the tube is chosen to substantially isolate the receiving means from vibrations generated during use of the pumping arrangement.

19. The kit according to claim 18 wherein at least some of the plurality of flexible capillary tubes have different internal diameters.

20. The kit according to claim 18 wherein the flexible capillary tubes can be cut to a predetermined length.

\* \* \* \* \*